(12) United States Patent
Poteet, Jr. et al.

(10) Patent No.: US 11,815,408 B2
(45) Date of Patent: Nov. 14, 2023

(54) TEMPERATURE SENSING DEVICE

(71) Applicant: WIKA Alexander Wiegand SE & Co. KG, Klingenberg (DE)

(72) Inventors: Robert Francis Poteet, Jr., Houston, TX (US); Dale Eugene Dutcher, Kingwood, TX (US)

(73) Assignee: WIKA Alexander Wiegand SE & Co. KG, Klingenberg (DE)

( * ) Notice: Subject to any disclaimer, the term of this patent is extended or adjusted under 35 U.S.C. 154(b) by 756 days.

(21) Appl. No.: 16/272,557

(22) Filed: Feb. 11, 2019

(65) Prior Publication Data

US 2020/0256743 A1 Aug. 13, 2020

(51) Int. Cl.
*H10N 10/01* (2023.01)
*H10N 10/17* (2023.01)
*G01K 7/02* (2021.01)
*G01K 7/06* (2006.01)

(52) U.S. Cl.
CPC ............... *G01K 7/023* (2013.01); *G01K 7/02* (2013.01); *G01K 7/06* (2013.01); *H10N 10/01* (2023.02); *H10N 10/17* (2023.02)

(58) Field of Classification Search
None
See application file for complete search history.

(56) References Cited

U.S. PATENT DOCUMENTS

| 2003/0016730 | A1* | 1/2003 | Daily | G01K 7/04 374/E1.005 |
| 2005/0259719 | A1* | 11/2005 | Phillips | G01K 7/04 374/179 |
| 2018/0238744 | A1* | 8/2018 | Harle | G01K 7/13 |
| 2019/0212207 | A1* | 7/2019 | Rao | G01K 7/02 |

FOREIGN PATENT DOCUMENTS

DE 82 35 842 U1 6/1983
DE 10 2007 000 029 B3 4/2008

* cited by examiner

*Primary Examiner* — Dustin Q Dam
(74) *Attorney, Agent, or Firm* — Muncy, Geissler, Olds & Lowe, P.C.

(57) ABSTRACT

The present disclosure relates to a temperature sensing device having a plurality of thermocouple arrangements, each of the thermocouple arrangements having a forward conductor and a plurality of return conductors electrically connected with the forward conductor, the return conductors having a different conductive material than the respectively associated forward conductor, electrical junctions or groups of electrical junctions of the return conductors to the respectively associated forward conductor being arranged at different longitudinal positions of the respectively associated forward conductor, and consecutive longitudinal positions of the electrical junctions or of groups of the electrical junctions of all thermocouple arrangements in the longitudinal direction of all forward conductors alternating between different forward conductors. Further, the present disclosure relates to a method of producing a temperature sensing device.

22 Claims, 9 Drawing Sheets

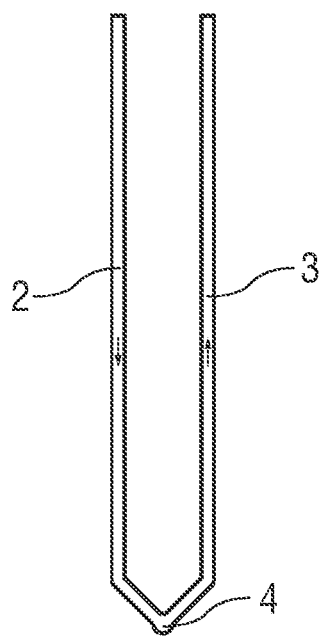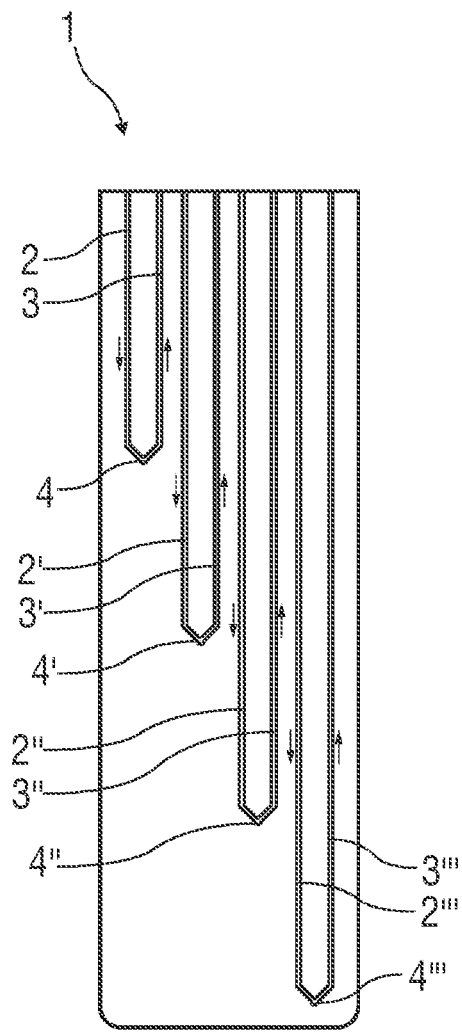
FIG 1
FIG 2

TEMPERATURE SENSING DEVICE

BACKGROUND OF THE DISCLOSURE

Field of the Disclosure

The present disclosure relates to a temperature sensing device.

Description of the Background Art

Temperature sensing devices are used to sense temperature at given locations. Temperature sensing devices may be configured as thermocouples or comprise one or more thermocouples comprising a pair of conductors of dissimilar electrically conductive materials such as different metals, wherein the conductors are joined at a point. A difference in potential created at the junction of the two metals depends on the temperature and can be measured by a detection instrument, such as a voltmeter, thus allowing detection of the temperature at the junction. The temperature sensing device may comprise two or more thermocouples having their junctions at distinct locations to allow detecting temperatures at these distinct locations. The thermocouples may be arranged within a sheath and be electrically insulated from each other by an electrical insulation material disposed about the thermocouples within the sheath.

SUMMARY OF THE DISCLOSURE

There is a need for an improved temperature sensing device.

According to an aspect of the present disclosure a temperature sensing device comprises a plurality of thermocouple arrangements, each of the thermocouple arrangements comprising a forward conductor and a plurality of return conductors electrically connected with the forward conductor, the return conductors being formed of a different conductive material than the respectively associated forward conductor, electrical junctions or groups of electrical junctions of the return conductors to the respectively associated forward conductor being arranged at different longitudinal positions of the respectively associated forward conductor, and consecutive longitudinal positions of the electrical junctions or of groups of the electrical junctions of all thermocouple arrangements in the longitudinal direction of all forward conductors alternating between different forward conductors. A group of electrical junctions shall be understood as two or more subsequent electrical junctions on one and the same forward conductor. The longitudinal position of a group of electrical junctions may be the average of the longitudinal positions of the electrical junctions of this group. In an exemplary embodiment, there is no overlap of the longitudinal positions of different groups of electrical junctions.

In an exemplary embodiment, each electrical junction of a return conductor to the respectively associated forward conductor forms a so called thermocouple. A thermocouple is an electrical device having two dissimilar electrical conductors forming electrical junctions at differing temperatures. A thermocouple produces a temperature-dependent voltage as a result of the thermoelectric effect, and this voltage can be interpreted to measure temperature.

In an exemplary embodiment, each forward conductor comprises an electrical junction, e.g. an additional electrical junction, to a return conductor at least at one longitudinal position, wherein these electrical junctions are arranged at a same longitudinal position in the longitudinal direction of all forward conductors.

In an exemplary embodiment, the forward conductors are concentrically arranged about a common axis.

In an exemplary embodiment, the return conductors are concentrically arranged about the common axis.

In an exemplary embodiment, the return conductors are arranged at a greater distance to the common axis than the forward conductors.

In an exemplary embodiment, the forward conductors extend linearly and are arranged at least essentially in parallel to each other.

In an exemplary embodiment, each forward conductor is twisted about a common axis in a longitudinal direction of the forward conductors, wherein all forward conductors may be uniformly twisted and wherein distances between the forward conductors and between the forward conductors and the common axis may be respectively constant.

In an exemplary embodiment, the twist at one of the electrical junctions of one of the forward conductors to one of the return conductors relative to an immediately preceding electrical junction of the same forward conductor to a different return conductor equals 360° divided by a number of the forward conductors.

In an exemplary embodiment, the twist at one of the electrical junctions of one of the forward conductors to one of the return conductors relative to an immediately preceding electrical junction of the same forward conductor to a different return conductor equals 360° divided by a number which may be different from a number of forward conductors.

In an exemplary embodiment, the case and the forward conductors and return conductors contained therein are twisted only once.

In an exemplary embodiment, a distance between immediately adjacent forward conductors is equal for all forward conductors.

In an exemplary embodiment, the thermocouple arrangements are respectively surrounded by an electrically insulating matrix.

In an exemplary embodiment, the thermocouple arrangements are arranged in a common case.

In an exemplary embodiment, the case is made of a material which is compatible with the conductor materials so that no cross-contamination occurs which may cause de-calibration over time.

In an exemplary embodiment, the case is surrounded by an outer protection sheath which may be more compatible with a process environment. The protection sheath allows for mechanically and chemically stabilizing a lateral area of the case.

In an exemplary embodiment, the case is cylindrical.

In an exemplary embodiment, spaces between the case, the forward conductors and the return conductors are filled, in particular entirely filled, with an electrically insulating matrix.

In an exemplary embodiment, electrical connection areas of the forward conductors and of the return conductors are lead out of the case at a common side.

In an exemplary embodiment, the electrical connection areas are led out of the case at a face side of the case.

In an exemplary embodiment, the junctions and/or the groups of junctions alternate between the forward conductors in a periodic pattern.

In an exemplary embodiment, a junction having a longitudinal position succeeding a preceding longitudinal position of a junction on one of the forward conductors is arranged on another one of the forward conductors immediately adjacent the one of the forward conductors in a direction. The direction may be a rotational direction about the common axis.

In an exemplary embodiment, the junctions and/or the groups of junctions alternate between the forward conductors in an aperiodic pattern.

In an exemplary embodiment, one, in particular each, forward conductor and the respectively associated return conductors are spatially clustered.

In an exemplary embodiment, the forward conductors and the associated return conductors are welded or brazed or soldered or fixed/connected in a different suitable way at the junctions.

According to an aspect of the present disclosure, a method of producing a temperature sensing device is provided, the temperature sensing device comprising a plurality of thermocouple arrangements, each of the thermocouple arrangements comprising a forward conductor and a plurality of return conductors electrically connected with the forward conductor, the return conductors being formed of a different conductive material than the respectively associated forward conductor, electrical junctions of the return conductors to the respectively associated forward conductor being arranged at different longitudinal positions of the respectively associated forward conductor, the method comprising: arranging consecutive longitudinal positions of the electrical junctions or of groups of the electrical junctions of all thermocouple arrangements in the longitudinal direction of all forward conductors in an alternating pattern between different forward conductors.

In an exemplary embodiment, the forward conductors and the return conductors are arranged in a common case having a lateral area and, in order to provide the at least one junction: the lateral area is opened at a longitudinal position; a return conductor is welded or brazed to a forward conductor at this longitudinal position; and the lateral area is subsequently closed.

In an exemplary embodiment, each of the forward conductors may be additionally electrically connected with a central return conductor, which may extend along the common axis.

In an exemplary embodiment, a central conductor is provided which may extend along the common axis, wherein the central conductor may be heated so that any twist in the temperature sensing device during manufacturing can easily be followed.

Further scope of applicability of the present disclosure will become apparent from the detailed description given hereinafter. However, it should be understood that the detailed description and specific examples, while indicating preferred embodiments of the disclosure, are given by way of illustration only, since various changes, combinations, and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus, are not limitative of the present disclosure, and wherein:

FIG. 1 is a schematic transparent view of a thermocouple arrangement according to the state of the art;

FIG. 2 is a schematic transparent and detail view of a temperature sensing device according to the state of the art;

DETAILED DESCRIPTION

Figure 3:
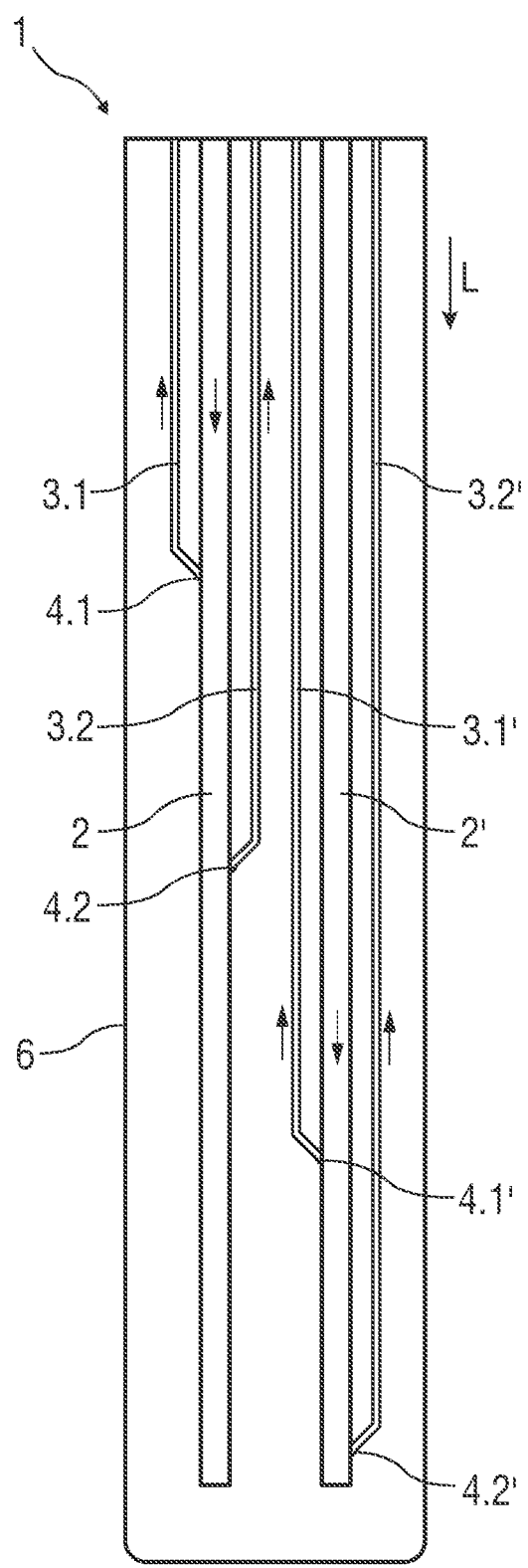
FIG. 3 is a schematic detail view of an exemplary embodiment of a temperature sensing device.

FIG. 1 is a schematic view of an exemplary embodiment of a thermocouple arrangement according to the state of the art. The thermocouple arrangement comprises a forward conductor 2 and a return conductor 3 electrically connected with the forward conductor 2 at a electrical junction 4. The forward conductor 2 is formed of a conductive material and the return conductor 3 is formed of a conductive material different than the conductive material of the associated forward conductor 2.

The electrical junction 4 of the return conductor 3 to the associated forward conductor 2 forms a so called thermocouple. A thermocouple is an electrical device having two dissimilar electrical conductors forming electrical junctions at differing temperatures. A thermocouple produces a temperature-dependent voltage as a result of the thermoelectric effect, and this voltage can be interpreted to measure temperature.

FIG. 2 is a schematic transparent and detail view of a temperature sensing device 1 according to the state of the art. The temperature sensing device 1 comprises a plurality of thermocouple arrangements, each of the thermocouple arrangements comprising one forward conductor 2, 2', 2'', 2''' and one return conductor 3, 3', 3'', 3''' electrically connected with the forward conductor 2, 2', 2'', 2'''' at a electrical junction 4, 4', 4'', 4'''.

The electrical junctions 4, 4', 4'', 4''' of the return conductors 3, 3', 3'', 3''' to the respectively associated forward conductor 2, 2', 2'', 2''' are arranged at different longitudinal positions of a case 6 of the temperature sensing device 1 to detect temperatures at different positions in an application.

FIG. 3 is a schematic transparent view of a temperature sensing device 1 according to the state of the art comprising a plurality of thermocouple arrangements arranged in a common case 6, each of the thermocouple arrangements comprising a forward conductor 2, 2' and a plurality of return conductors 3.1, 3.2, 3.1', 3.2' electrically connected with the forward conductor 2, 2' at electrical junctions 4.1, 4.2, 4.1', 4.2'. In the embodiment, return conductors 3.1, 3.2 are connected at electrical junctions 4.1, 4.2 to the forward conductor 2. Return conductors 3.1', 3.2' are connected at electrical junctions 4.1', 4.2' to the forward conductor 2'. The electrical junctions 4.1, 4.2, 4.1', 4.2' of the return conductors 3.1, 3.2, 3.1', 3.2' to the respectively associated forward conductor 2, 2' are arranged at different longitudinal positions of the respectively associated forward conductor 2, 2'. Thus the electrical junctions 4.1, 4.2, 4.1', 4.2' have the order 4.1, 4.2, 4.1', 4.2' along a longitudinal direction L.

Figure 4:
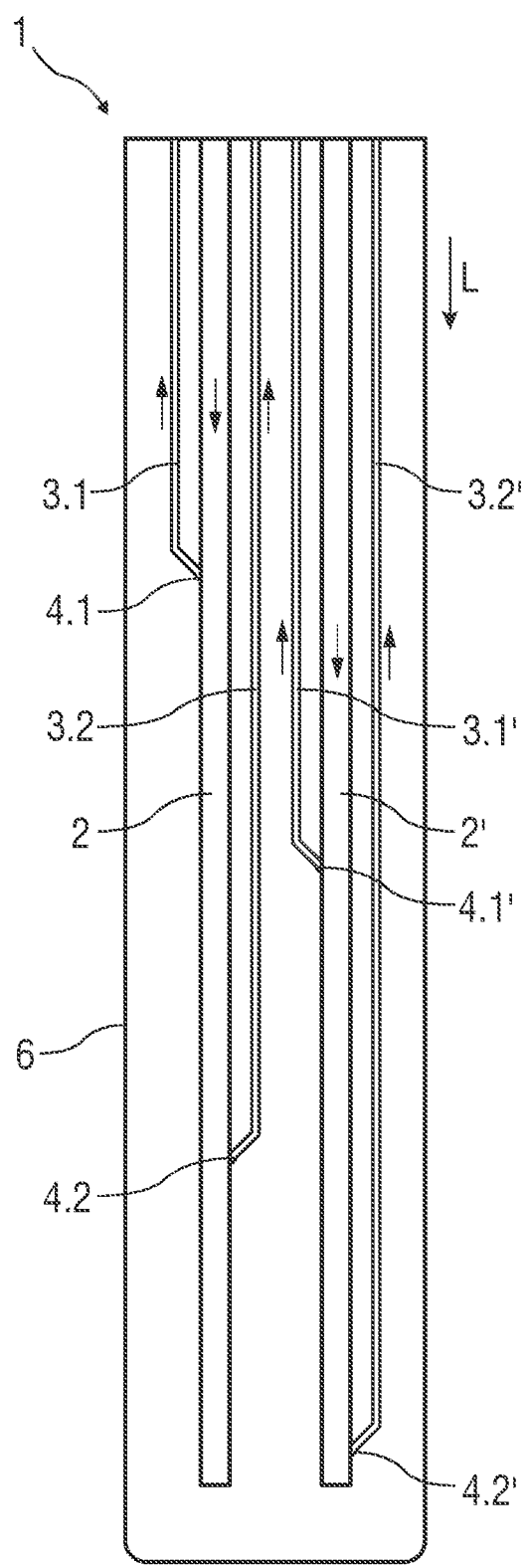
FIG. 4 is a schematic detail view of another exemplary embodiment of a temperature sensing device.

FIG. 4 is a schematic transparent view of an exemplary embodiment of a temperature sensing device 1 comprising a plurality of thermocouple arrangements, each of the thermocouple arrangements comprising a forward conductor 2, 2' and a plurality of return conductors 3.1, 3.2, 3.1', 3.2' electrically connected with the forward conductor 2, 2' at electrical junctions 4.1, 4.2, 4.1', 4.2'. In the embodiment, return conductors 3.1, 3.2 are connected at electrical junctions 4.1, 4.2 to the forward conductor 2. Return conductors 3.1', 3.2' are connected at electrical junctions 4.1', 4.2' to the forward conductor 2'. The forward conductors 2, 2' being formed of a conductive material and the return conductors 3.1, 3.2, 3.1', 3.2' being formed of a conductive material different than the conductive material of the respectively associated forward conductor 2, 2'. In an exemplary embodiment, the electrical junctions 4.1, 4.2, 4.1', 4.2' of the return conductors 3.1, 3.2, 3.1', 3.2' to the respectively associated forward conductor 2, 2' are arranged at different longitudinal positions of the respectively associated forward conductor 2, 2'. In an exemplary embodiment, consecutive longitudinal positions of the electrical junctions 4.1, 4.2, 4.1', 4.2' of both thermocouple arrangements in a longitudinal direction L of all forward conductors 2, 2' alternate between different forward conductors 2, 2' such that the electrical junctions 4.1, 4.2, 4.1', 4.2' have the order 4.1, 4.1', 4.2, 4.2' along the longitudinal direction L and all electrical junctions 4.1, 4.2, 4.1', 4.2' or most of them are at distinct longitudinal positions.

In an exemplary embodiment, the forward conductors 2, 2' extend linearly and are arranged at least essentially in parallel to each other. In other embodiments, the forward conductors 2, 2' may be arranged in a different way.

In an exemplary embodiment, the thermocouple arrangements are respectively surrounded by an electrically insulating matrix 5.

In an exemplary embodiment, the thermocouple arrangements are arranged in a common case 6. The common case 6 may be cylindrical, e.g. with a circular cross section. Spaces between the case 6, the forward conductors 2, 2' and the return conductors 3.1, 3.2, 3.1', 3.2' may be filled, in particular entirely filled, with an electrically insulating matrix 5.

The forward conductors 2, 2' and the associated return conductors 3.1, 3.2, 3.1', 3.2' are welded or brazed or soldered at the junctions 4.1, 4.2, 4.1', 4.2'.

Figure 5:
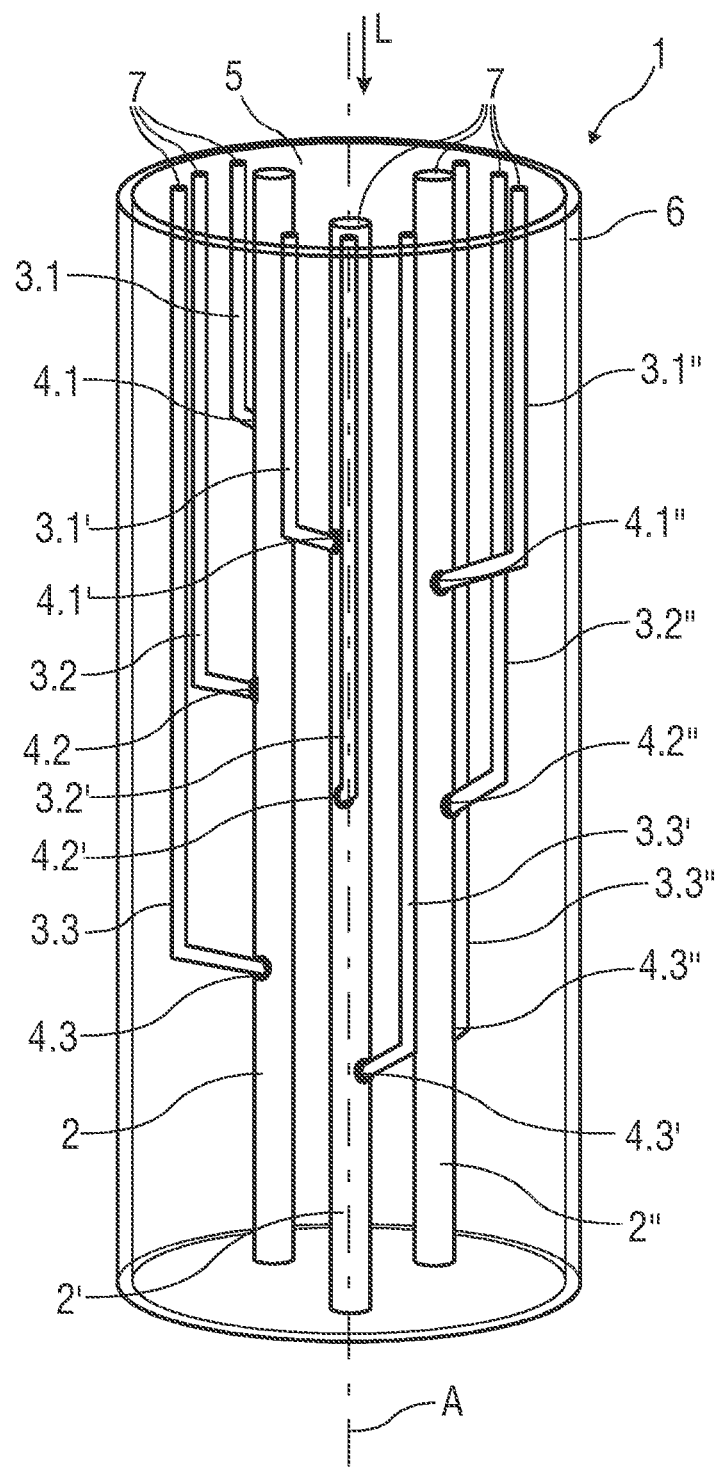
FIG. 5 is a schematic transparent view of an exemplary embodiment of a temperature sensing device.

FIG. 5 is a schematic transparent view of an exemplary embodiment of a temperature sensing device 1 comprising a plurality of thermocouple arrangements, each of the thermocouple arrangements comprising a forward conductor 2, 2', 2" and a plurality of return conductors 3.1, 3.2, 3.3, 3.1', 3.2', 3.3', 3.1", 3.2", 3.3" electrically connected with the forward conductor 2, 2', 2" at electrical junctions 4.1, 4.2, 4.3, 4.1', 4.2', 4.3', 4.1", 4.2", 4.3". In the embodiment, return conductors 3.1, 3.2, 3.3 are connected at electrical junctions 4.1, 4.2, 4.3 to the forward conductor 2. Return conductors 3.1', 3.2', 3.3' are connected at electrical junctions 4.1', 4.2', 4.3' to the forward conductor 2'. Return conductors 3.1", 3.2", 3.3" are connected at electrical junctions 4.1", 4.2", 4.3" to the forward conductor 2". The forward conductors 2, 2', 2" being formed of a conductive material and the return conductors 3.1, 3.2, 3.3, 3.1', 3.2', 3.3', 3.1", 3.2", 3.3" being formed of a conductive material different than the conductive material of the respectively associated forward conductor 2, 2', 2". In an exemplary embodiment, the electrical junctions 4.1, 4.2, 4.3, 4.1', 4.2', 4.3', 4.1", 4.2", 4.3" of the return conductors 3.1, 3.2, 3.3, 3.1', 3.2', 3.3', 3.1", 3.2", 3.3" to the respectively associated forward conductor 2, 2', 2" are arranged at different longitudinal positions of the respectively associated forward conductor 2, 2', 2". In an exemplary embodiment, consecutive longitudinal positions of the electrical junctions 4.1, 4.2, 4.3, 4.1', 4.2', 4.3', 4.1", 4.2", 4.3" of all thermocouple arrangements in a longitudinal direction L of all forward conductors 2, 2', 2" alternate between different forward conductors 2, 2', 2" such that the electrical junctions 4.1, 4.2, 4.3, 4.1', 4.2', 4.3', 4.1", 4.2", 4.3" have the order 4.1, 4.1', 4.1", 4.2, 4.2', 4.2", 4.3, 4.3', 4.3" along the longitudinal direction L and all electrical junctions 4.1, 4.2, 4.3, 4.1', 4.2', 4.3', 4.1", 4.2", 4.3" or most of them are at distinct longitudinal positions.

In an exemplary embodiment, the forward conductors 2, 2', 2" are concentrically arranged about a common axis A. The return conductors 3.1, 3.2, 3.3, 3.1', 3.2', 3.3', 3.1", 3.2", 3.3" may also be concentrically arranged about the common axis A. The return conductors 3.1, 3.2, 3.3, 3.1', 3.2', 3.3', 3.1", 3.2", 3.3" may be arranged at a greater distance to the common axis A than the forward conductors 2, 2', 2".

In an exemplary embodiment, the forward conductors 2, 2', 2" extend linearly and are arranged at least essentially in parallel to each other and thus to the common axis A. In other embodiments, the forward conductors 2, 2', 2" may be arranged in a different way.

In an exemplary embodiment, a distance between immediately adjacent forward conductors 2, 2', 2" is equal for all forward conductors 2, 2', 2". In other embodiments, the distance between the forward conductors 2, 2', 2" may vary.

In an exemplary embodiment, the thermocouple arrangements are respectively surrounded by an electrically insulating matrix 5.

In an exemplary embodiment, the thermocouple arrangements are arranged in a common case 6. The common case 6 may be cylindrical, e.g. with a circular cross section. Spaces between the case 6, the forward conductors 2, 2', 2" and the return conductors 3.1, 3.2, 3.3, 3.1', 3.2', 3.3', 3.1", 3.2", 3.3" may be filled, in particular entirely filled, with an electrically insulating matrix.

The forward conductors 2, 2', 2" and the return conductors 3.1, 3.2, 3.3, 3.1', 3.2', 3.3', 3.1", 3.2", 3.3" respectively comprise connection areas 7 which may be lead out of the case 6 at a common side, e.g. at a face side of the cylindrical case 6.

In the embodiment of FIG. 5 each forward conductor 2, 2', 2" and the respectively associated return conductors 3.1, 3.2, 3.3, 3.1', 3.2', 3.3', 3.1", 3.2", 3.3" are spatially clustered, i.e. the return conductors 3.1, 3.2, 3.3 are closer to the forward conductor 2 than to any other forward conductor 2', 2" or return conductor 3.1', 3.2', 3.3', 3.1", 3.2", 3.3", the return conductors 3.1', 3.2', 3.3' are closer to the forward conductor 2' than to any other forward conductor 2, 2" or return conductor 3.1, 3.2, 3.3, 3.1", 3.2", 3.3", and the return conductors 3.1", 3.2", 3.3" are closer to the forward conductor 2" than to any other forward conductor 2, 2' or return conductor 3.1, 3.2, 3.3, 3.1', 3.2', 3.3'.

The forward conductors 2, 2', 2" and the associated return conductors 3.1, 3.2, 3.3, 3.1', 3.2', 3.3', 3.1", 3.2", 3.3" are welded or brazed or soldered at the junctions 4.1, 4.2, 4.3, 4.1', 4.2', 4.3', 4.1", 4.2", 4.3".

Figure 6:
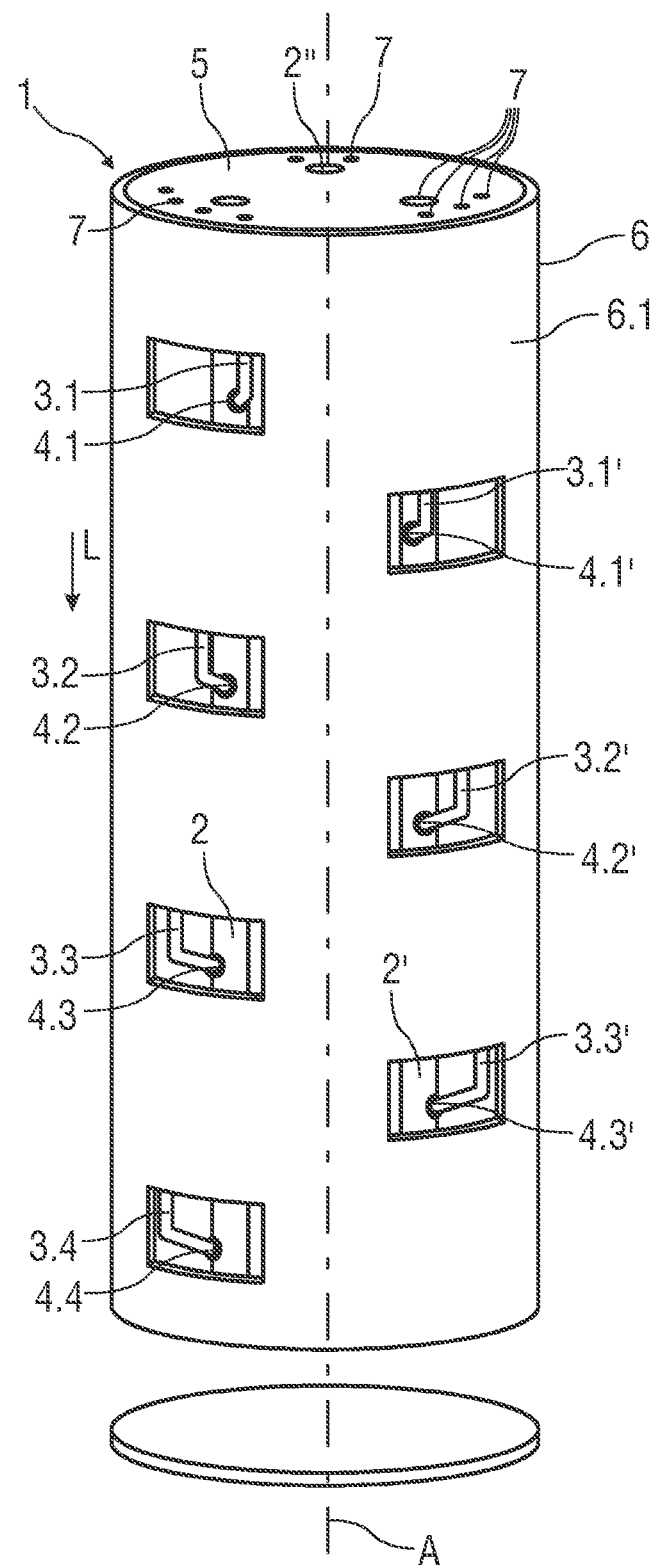
FIG. 6 is a schematic view of an exemplary embodiment of a temperature sensing device.

FIG. 6 is a schematic view of an exemplary embodiment of a temperature sensing device 1 comprising a plurality of thermocouple arrangements, each of the thermocouple arrangements comprising a forward conductor 2, 2', 2" and a plurality of return conductors 3.1, 3.2, 3.3, 3.4, 3.1', 3.2', 3.3', 3.1", 3.2" electrically connected with the forward conductor 2, 2', 2" at electrical junctions 4.1, 4.2, 4.3, 4.4, 4.1', 4.2', 4.3', 4.1", 4.2". In the embodiment, return conductors 3.1, 3.2, 3.3, 3.4 are connected at electrical junctions 4.1, 4.2, 4.3, 4.4 to the forward conductor 2. Return conductors 3.1', 3.2', 3.3' are connected at electrical junctions 4.1', 4.2', 4.3' to the forward conductor 2'. Return conductors 3.1", 3.2" are connected at electrical junctions 4.1", 4.2" to the forward conductor 2". The forward conductors 2, 2', 2" being formed of a conductive material and the return conductors 3.1, 3.2, 3.3, 3.4, 3.1', 3.2', 3.3', 3.1", 3.2" being formed of a conductive material different than the conductive material of the respectively associated forward conductor 2, 2', 2". In an exemplary embodiment, the electrical junctions 4.1, 4.2, 4.3, 4.4, 4.1', 4.2', 4.3', 4.1", 4.1" of the return conductors 3.1, 3.2, 3.3, 3.4, 3.1', 3.2', 3.3', 3.1", 3.2" to the respectively associated forward conductor 2, 2', 2" are arranged at different longitudinal positions of the respectively associated forward conductor 2, 2', 2". In an exemplary embodiment, consecutive longitudinal positions of the electrical junctions 4.1, 4.2, 4.3, 4.4, 4.1', 4.2', 4.3', 4.1", 4.2" of all thermocouple arrangements in a longitudinal direction L of the forward conductors 2, 2', 2" alternate between different forward conductors 2, 2', 2" such that the electrical junctions 4.1, 4.2, 4.3, 4.4, 4.1', 4.2', 4.3', 4.1", 4.2" have the order 4.1, 4.1', 4.1", 4.2, 4.2', 4.2", 4.3, 4.3', 4.4, along the longitudinal direction L and all electrical junctions 4.1, 4.2, 4.3, 4.4, 4.1', 4.2', 4.3', 4.1", 4.2" or most of them are at distinct longitudinal positions.

In an exemplary embodiment, the forward conductors 2, 2', 2" are concentrically arranged about a common axis A. The return conductors 3.1, 3.2, 3.3, 3.4, 3.1', 3.2', 3.3', 3.1", 3.2" may also be concentrically arranged about the common axis A. The return conductors 3.1, 3.2, 3.3, 3.4, 3.1', 3.2', 3.3', 3.1", 3.2" may be arranged at a greater distance to the common axis A than the forward conductors 2, 2', 2".

In an exemplary embodiment, the forward conductors 2, 2', 2" extend linearly and are arranged at least essentially in parallel to each other and thus to the common axis A. In other embodiments, the forward conductors 2, 2', 2" may be arranged in a different way.

In an exemplary embodiment, a distance between immediately adjacent forward conductors 2, 2', 2" is equal for all forward conductors 2, 2', 2". In other embodiments, the distance between the forward conductors 2, 2', 2" may vary.

In an exemplary embodiment, the thermocouple arrangements are respectively surrounded by an electrically insulating matrix 5.

In an exemplary embodiment, the thermocouple arrangements are arranged in a common case 6. The common case 6 may be cylindrical, e.g. with a circular cross section. Spaces between the case 6, the forward conductors 2, 2', 2" and the return conductors 3.1, 3.2, 3.3, 3.4, 3.1', 3.2', 3.3', 3.1", 3.2" may be filled, in particular entirely filled, with an electrically insulating matrix 5.

The forward conductors 2, 2', 2" and the return conductors 3.1, 3.2, 3.3, 3.4, 3.1', 3.2', 3.3', 3.1", 3.2" respectively comprise connection areas 7 which may be lead out of the case 6 at a common side, e.g. at a face side of the cylindrical case 6.

The forward conductors 2, 2', 2" and the associated return conductors 3.1, 3.2, 3.3, 3.4, 3.1', 3.2', 3.3', 3.1", 3.2" are welded at the junctions 4.1, 4.2, 4.3, 4.4, 4.1', 4.2', 4.3', 4.1", 4.2".

In the embodiments of FIGS. 5 and 6 the junctions 4.1, 4.2, 4.3, 4.4, 4.1', 4.2', 4.3', 4.1", 4.2", 4.3" and/or the groups of junctions alternate between the forward conductors in a periodic pattern, in particular such that a junction 4.1, 4.2, 4.3, 4.4, 4.1', 4.2', 4.3', 4.1", 4.2", 4.3" or any junction 4.1, 4.2, 4.3, 4.4, 4.1', 4.2', 4.3', 4.1", 4.2", 4.3" having a longitudinal position succeeding a preceding longitudinal position of another junction 4.1, 4.2, 4.3, 4.4, 4.1', 4.2', 4.3', 4.1", 4.2", 4.3" on one of the forward conductors 2, 2', 2" is arranged on another one of the forward conductors 2, 2', 2" immediately adjacent the one of the forward conductors 2, 2', 2" in a direction, in particular in a rotational direction about the common axis A. In other embodiments, there may be four or more forward conductors 2, 2', 2" and the alternation may be between forward conductors 2, 2', 2" which are not immediately adjacent each other.

A method of producing a temperature sensing device 1, e.g. the one of FIG. 5 or 6, may comprise arranging electrical junctions 4.1, 4.2, 4.3, 4.4, 4.1', 4.2', 4.3', 4.1", 4.2", 4.3" of all thermocouple arrangements at consecutive longitudinal positions in the longitudinal direction L of the forward conductors 2, 2', 2" in a pattern alternating between different forward conductors 2, 2', 2" of all thermocouple arrangements.

The forward conductors 2, 2', 2" and the return conductors 3.1, 3.2, 3.3, 3.4, 3.1', 3.2', 3.3', 3.1", 3.2", 3.3" are arranged in the common case 6 which has a lateral area 6.1 and, in order to provide the junctions 4.1, 4.2, 4.3, 4.4, 4.1', 4.2', 4.3', 4.1", 4.2", 4.3", the lateral area 6.1 is opened at a longitudinal position, one of the return conductors 3.1, 3.2, 3.3, 3.4, 3.1', 3.2', 3.3', 3.1", 3.2", 3.3" is welded to one of the forward conductors 2, 2', 2" at this longitudinal position, and the lateral area is subsequently closed.

Figure 7:
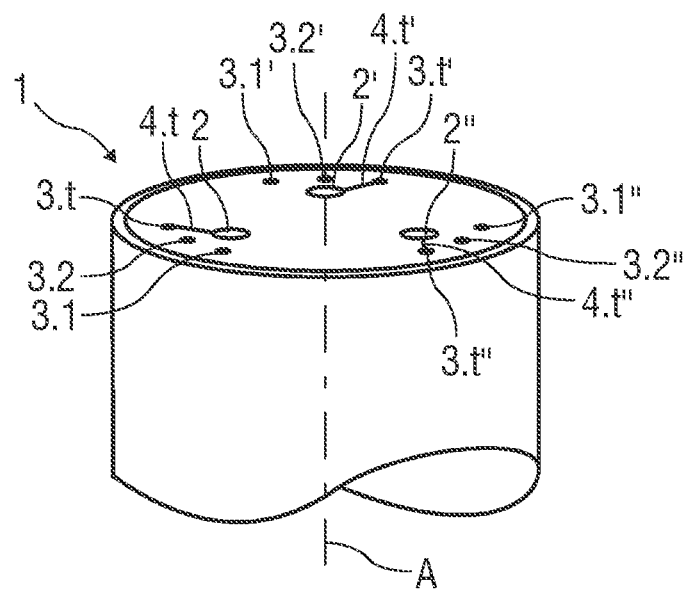
FIG. 7 is a schematic detail view of an exemplary embodiment of a temperature sensing device.

FIG. 7 is a schematic detail view of an exemplary embodiment of a temperature sensing device 1 similar to the one of FIG. 5. In addition to the configuration of FIG. 5, each forward conductor 2, 2', 2" comprises an additional electrical junction 4.t, 4.t', 4.t" to a return conductor 3.t, 3.t', 3.t" at least at one longitudinal position so that all these additional electrical junctions 4.t, 4.t', 4.t" have the same longitudinal position in particular at or near an end of the case 6 opposite to the connection areas 7. Thus, interruptions in the forward conductors 2, 2', 2" can be detected.

Figure 8:
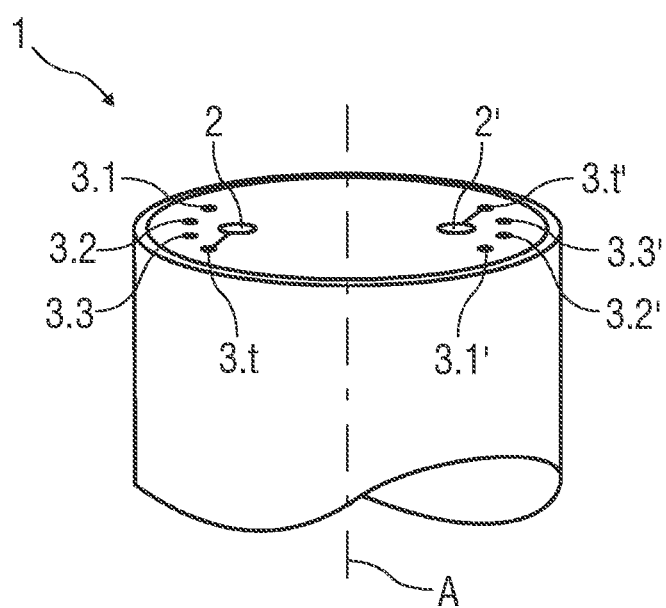
FIG. 8 is a schematic detail view of another exemplary embodiment of a temperature sensing device.

FIG. 8 is a schematic detail view of an exemplary embodiment of a temperature sensing device 1 similar to the one of FIG. 7 with only two forward conductors 2, 2' and respective additional electrical junctions 4.t, 4.t'.

Figure 9:
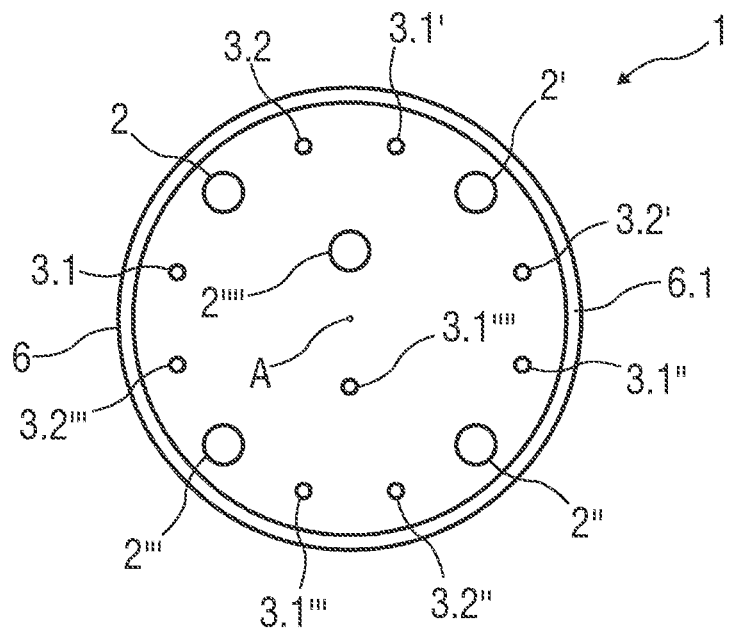
FIG. 9 is a schematic detail view of an exemplary embodiment of a temperature sensing device.

FIG. 9 is a schematic detail view of an exemplary embodiment of a temperature sensing device 1 with five forward conductors 2, 2', 2", 2''', 2'''', wherein four forward conductors 2, 2', 2", 2''' are concentrically arranged about the common axis A near the lateral area 6.1. Each of these forward conductors 2, 2', 2", 2''' is electrically connected to two return conductors 3.1, 3.2, 3.1', 3.2', 3.1", 3.2", 3.1''', 3.2''' which are concentrically arranged about the common axis A at the same distance to the axis A as the forward conductors 2, 2', 2", 2'''. A fifth forward conductor 2'''' and an accompanying return conductor 3.1'''' are concentrically arranged about the common axis A at the same distance to the axis A, wherein the distance is smaller than the distance of the forward conductors 2, 2', 2", 2''' to the axis A.

Such an arrangement of the forward conductors 2, 2', 2", 2''', 2'''' and return conductors 3.1, 3.2, 3.1', 3.2', 3.1", 3.2", 3.1''', 3.2''', 3.1'''' allows for a particularly good exploitation of a cross section of the temperature sensing device 1. The arrangement of the forward conductors 2, 2', 2'', 2''' and return conductors 3.1, 3.2, 3.1', 3.2', 3.1'', 3.2'', 3.1''', 3.2''' near the lateral area 6.1 of the case 6 allows a particularly short response time to a temperature change.

Figure 10:
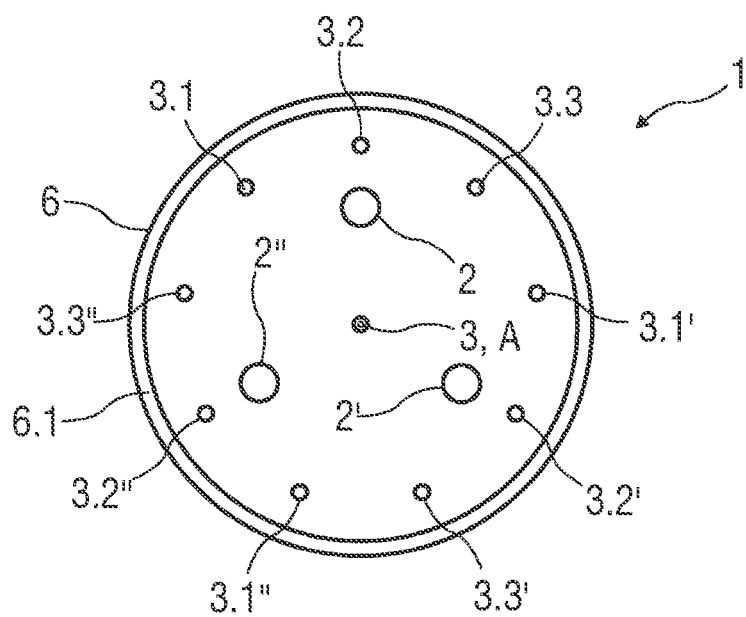
FIG. 10 is a schematic detail view of an exemplary embodiment of a temperature sensing device.

FIG. 10 is a schematic detail view of an exemplary embodiment of a temperature sensing device 1 with three forward conductors 2, 2', 2'', wherein the forward conductors 2, 2', 2'' are concentrically arranged about the common axis A near the axis A. Each of these forward conductors 2, 2', 2'' is electrically connected with three return conductors 3.1, 3.2, 3.3, 3.1', 3.2', 3.3', 3.1'', 3.2'', 3.3'' which are concentrically arranged about the common axis A at a greater distance to the axis A as the forward conductors 2, 2', 2'' and near the lateral area 6.1. Additionally, each of these forward conductors 2, 2', 2'' is electrically connected with a central return conductor 3, which extends along the axis A.

Such a ten-point-arrangement of the forward conductors 2, 2', 2'' and return conductors 3, 3.1, 3.2, 3.3, 3.1', 3.2', 3.3', 3.1'', 3.2'', 3.3'' allows for a particularly good exploitation of a cross section of the temperature sensing device 1.

Furthermore, the central return conductor 3 joined to each and any forward conductor 2, 2', 2'' allows for getting an additional junction which is formed at the distal end of the closed end common case 6.

In a not illustrated exemplary embodiment of a temperature sensing device 1 a central wire or small tube extends along the axis A instead of the central return conductor 3 wherein the wire or tube could be used for other diagnostic or operational needs.

In an exemplary embodiment of the temperature sensing device 1 the central wire may be heated so that any twist in the temperature sensing device 1 during manufacturing can easily be followed.

In an exemplary embodiment of the temperature sensing device 1 the central wire forms a single or duplex thermocouple, which could be formed at the distal end of the temperature sensing device 1.

Figure 11:
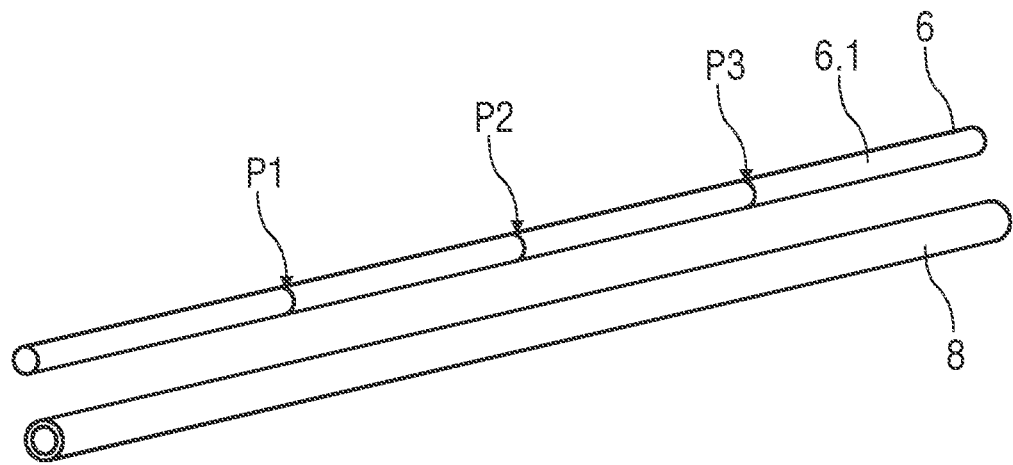
FIG. 11 is a schematic view of an exemplary embodiment of a temperature sensing device.

FIG. 11 is a schematic view of an exemplary embodiment of a temperature sensing device 1 with a protection sheath 8. The case 6 and the forward conductors 2, 2', 2'' and return conductors 3.1, 3.2, 3.3, 3.4, 3.1', 3.2', 3.3', 3.1'', 3.2'', 3.3'' contained therein are twisted by a predetermined angle at the positions P1, P2, P3. The angle may be between 10° and 180°, depending on the number forward conductors 2, 2', 2'', e.g. between 10° and 120°, e.g. between 10° and 60°, e.g. between 10° and 30°. It is possible that the sheath 8 is made of different material than the case, wherein the material may be more resistant to corrosion, cracking, etc.

In a not illustrated exemplary embodiment of a temperature sensing device 1 the case 6 and the forward conductors 2, 2', 2'' and return conductors 3.1, 3.2, 3.3, 3.4, 3.1', 3.2', 3.3', 3.1'', 3.2'', 3.3'' contained therein are not twisted.

The protection sheath 8 may surround the temperature sensing device 1. The protection sheath 8 allows mechanically stabilizing the lateral area 6.1 in the area of the positions P1 to P3 to compensate for weakening of the material caused by twisting and/or caused by opening the lateral area to provide the junctions 4.1, 4.2, 4.3, 4.4, 4.1', 4.2', 4.3', 4.1'', 4.2'', 4.3''. Furthermore the protection sheath 8 allows to fix the twist of the case 6 and therefore of the forward conductors 2, 2', 2'' and return conductors 3.1, 3.2, 3.3, 3.4, 3.1', 3.2', 3.3', 3.1'', 3.2'', 3.3'' contained therein and prevents a relaxing of the twist at high temperatures.

Figure 12:
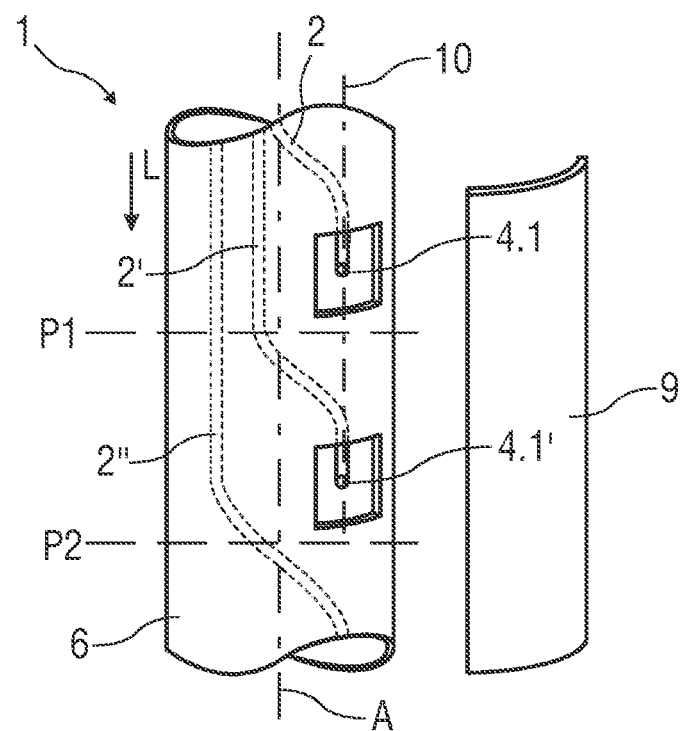
FIG. 12 is a schematic sectional view of an exemplary embodiment of a temperature sensing device.

FIG. 12 is a schematic detail view of an exemplary embodiment of a temperature sensing device 1 similar to the ones shown in any one of FIGS. 5 to 8. In the embodiment of FIG. 12, the forward conductors 2, 2', 2'' are respectively twisted about the common axis A in a longitudinal direction L of the forward conductors 2, 2', 2''. All forward conductors 2, 2', 2'' are twisted, for example uniformly twisted. Distances between the forward conductors 2, 2', 2'' and between the forward conductors 2, 2', 2'' and the common axis A may be respectively constant. In the illustrated embodiment, the forward conductors 2, 2', 2'' have straight sections in parallel with the longitudinal direction L and twisted sections. In other embodiments, the forward conductors 2, 2', 2'' may be constantly twisted about the common axis A such that each forward conductor 2, 2', 2'' forms a helix.

In an exemplary embodiment, the twist at one of the electrical junctions 4.1, 4.1' of one of the forward conductors 2, 2', 2'' to one of the return conductors 3.1, 3.1' relative to an immediately preceding electrical junction of the same forward conductor 2, 2', 2'' to a different return conductor 3.1, 3.1' equals 360° divided by the number of the forward conductors 2, 2', 2''. In the case of three forward conductors 2, 2', 2'' as illustrated, the twist between two adjacent electrical junctions on one and the same forward conductor 2, 2', 2'' is thus 120°.

In a not illustrated exemplary embodiment of a temperature sensing device 1 the case 6 and the forward conductors 2, 2', 2'' and return conductors 3.1, 3.2, 3.3, 3.4, 3.1', 3.2', 3.3', 3.1'', 3.2'', 3.3'' contained therein are twisted by a predetermined angle at a number of positions, wherein the twist equals 360° divided by a number which may be different from a number of forward conductors 2, 2', 2''. It is also possible, that the case 6 and the forward conductors 2, 2', 2'' and return conductors 3.1, 3.2, 3.3, 3.4, 3.1', 3.2', 3.3', 3.1'', 3.2'', 3.3'' contained therein are twisted only once.

Figure 13:
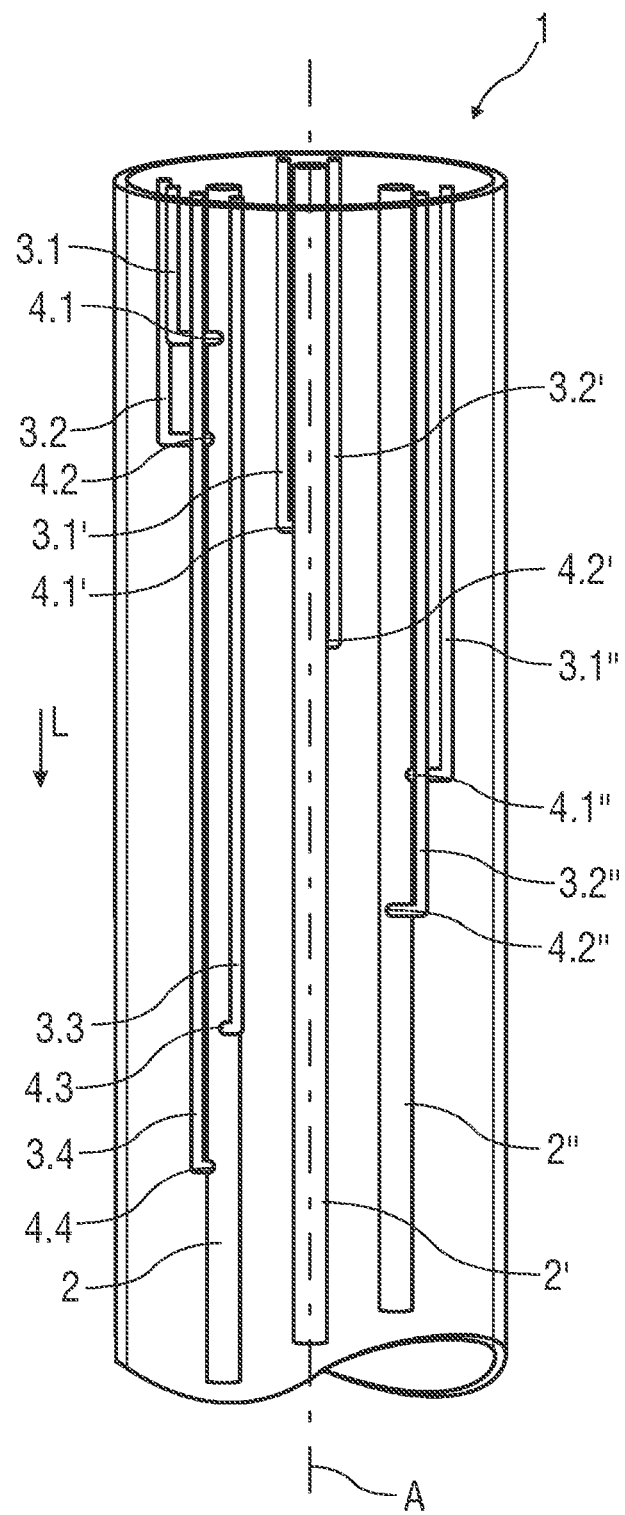
FIG. 13 is is a schematic detail view of an exemplary embodiment of a temperature sensing device 1.

FIG. 13 is a schematic detail view of an exemplary embodiment of a temperature sensing device 1 which may be similar to the embodiments shown in any one of the preceding FIGS. 4 to 12 except that consecutive longitudinal positions of the electrical junctions 4.1, 4.2, 4.3, 4.4, 4.1', 4.2'', 4.1'', 4.2'' of all thermocouple arrangements in a longitudinal direction L of all forward conductors 2, 2', 2'' do not alternate every time between different forward conductors 2, 2', 2'' but there are groups of two or more subsequent electrical junctions 4.1, 4.2, 4.3, 4.4, 4.1', 4.2', 4.1'', 4.2'' on the same forward conductor 2, 2', 2'' and the alternation is between the groups on the different forward conductors 2, 2', 2''. The electrical junctions 4.1, 4.2, 4.3, 4.4, 4.1', 4.2', 4.1'', 4.2'' have thus the order 4.1, 4.2, 4.1', 4.2', 4.1'', 4.2'', 4.3, 4.4, etc. along the longitudinal direction L and all electrical junctions 4.1, 4.2, 4.3, 4.4, 4.1', 4.2', 4.1'', 4.2'' or most of them or groups of them are at distinct longitudinal positions.

In order to provide the junctions 4.1, 4.2, 4.3, 4.4, 4.1', 4.2', 4.3', 4.1'', 4.2'', 4.3'', the lateral area 6.1 is opened at a longitudinal position, one of the return conductors 3.1, 3.2, 3.3, 3.4, 3.1', 3.2', 3.3', 3.1'', 3.2'', 3.3'' is welded to one of the forward conductors 2, 2', 2'' at this longitudinal position, and the openings in the lateral area is subsequently closed by a plate 9, for example by welding or brazing the plate 9 on the lateral area 6.1.

In a not illustrated exemplary embodiment of a temperature sensing device 1 the dimensions of the plate correspond to the dimensions of the openings in the lateral area 6.1, so that the plate 9 forms a patch.

In a not illustrated exemplary embodiment of a temperature sensing device 1 the openings in the lateral area are closed by a protection sheath 8 shown in FIG. 11.

The groups of junctions 4.1, 4.2, 4.3, 4.4, 4.1', 4.2', 4.1", 4.2" may alternate between the forward conductors 2, 2', 2" in a periodic pattern as shown or in an aperiodic pattern (not shown).

In other embodiments there may be three or more subsequent junctions on the same forward conductor in a group before the alternation.

In other embodiments there may be 12 to 14 thermocouples in the outer row by using a so called duplex tip concept without increasing the conductor size.

In other embodiments the conductor size is increased to get more thermocouples. This results in a longer service life.

The disclosure being thus described, it will be obvious that the same may be varied in many ways. Such variations are not to be regarded as a departure from the spirit and scope of the disclosure, and all such modifications as would be obvious to one skilled in the art are to be included within the scope of the following claims.

What is claimed is:

1. A temperature sensing device, comprising:
   a plurality of thermocouple arrangements, each of the plurality of thermocouple arrangements comprising a forward conductor and a plurality of return conductors electrically connected with the forward conductor, an entirety of the forward conductor being formed of a same conductive material and the plurality of return conductors being formed of a different conductive material than a respectively associated forward conductor; and
   electrical junctions or groups of the electrical junctions of the plurality of return conductors to the respectively associated forward conductor being arranged at different longitudinal positions of the respectively associated forward conductor, and
   wherein consecutive longitudinal positions of the electrical junctions or of the groups of the electrical junctions of all thermocouple arrangements, in the longitudinal direction of all forward conductors, alternate between each forward conductor, such that the longitudinal positions of the electrical junctions or of the groups of electrical junctions of each forward conductor differ from one another.

2. The temperature sensing device of claim 1, wherein each forward conductor comprises an additional electrical junction to a return conductor, wherein the additional electrical junction is arranged at a same longitudinal position in the longitudinal direction of all forward conductors.

3. The temperature sensing device of claim 1, wherein the forward conductor of each of the plurality of thermocouple arrangements are concentrically arranged about a common axis.

4. The temperature sensing device of claim 3, wherein the plurality of return conductors are concentrically arranged about the common axis.

5. The temperature sensing device of claim 4, wherein the plurality of return conductors are arranged at a greater distance to the common axis than each forward conductor.

6. The temperature sensing device according to claim 1, wherein the forward conductor of each of the plurality of thermocouple arrangements extend linearly and are arranged parallel to each other.

7. The temperature sensing device according to claim 1, wherein each forward conductor is twisted about a common axis in a longitudinal direction of each forward conductor, wherein all forward conductors are uniformly twisted and wherein distances between each forward conductor and between each forward conductor and the common axis are respectively constant.

8. The temperature sensing device of claim 7, wherein the twist at one of the electrical junctions of one forward conductor to one of the plurality of return conductors relative to an immediately preceding electrical junction of the same forward conductor to a different return conductor equals 360° divided by a number of all forward conductors.

9. The temperature sensing device of claim 7, wherein a distance between immediately adjacent forward conductors is equal for all forward conductors.

10. The temperature sensing device according to claim 1, wherein the plurality of thermocouple arrangements are respectively surrounded by an electrically insulating matrix.

11. The temperature sensing device according to claim 1, wherein the plurality of thermocouple arrangements are arranged in a common case.

12. The temperature sensing device of claim 11, wherein the case is cylindrical.

13. The temperature sensing device according to claim 11, wherein spaces between the case, each forward conductor and the plurality of return conductors are entirely filled with an electrically insulating matrix.

14. The temperature sensing device according to claim 11, wherein electrical connection areas of each forward conductor and of the plurality of return conductors are led out of the case at a common side.

15. The temperature sensing device of claim 14, wherein the common side of the case is an end face of the case.

16. The temperature sensing device according to claim 1, wherein the electrical junctions and/or the groups of electrical junctions alternate between each forward conductor in a periodic pattern.

17. The temperature sensing device according to claim 16, wherein an electrical junction having a longitudinal position succeeding a preceding longitudinal position of an electrical junction on one forward conductor is arranged on another forward conductor immediately adjacent the one forward conductor in a direction.

18. The temperature sensing device according to claim 1 wherein the electrical junctions and/or the groups of electrical junctions alternate between each forward conductor in an aperiodic pattern.

19. The temperature sensing device according to claim 1, wherein each forward conductor and the plurality of return conductors are spatially clustered.

20. The temperature sensing device according to claim 1, wherein each forward conductor and the plurality of return conductors are one of welded, brazed and soldered at the electrical junctions.

21. A method of producing a temperature sensing device, the method comprising:
   providing a plurality of thermocouple arrangements, each of the plurality of thermocouple arrangements comprising a forward conductor and a plurality of return conductors electrically connected with the forward conductor, an entirety of the forward conductor being formed of a same conductive material and the plurality of return conductors being formed of a different conductive material than a respectively associated forward conductor, electrical junctions or groups of the electrical junctions of the plurality of return conductors to the respectively associated forward conductor being arranged at different longitudinal positions of the respectively associated forward conductor; and arranging consecutive longitudinal positions of the electrical junctions or the groups of the electrical junctions of all thermocouple arrangements, in the longitudinal direction of all forward conductors, in an alternating pattern between each forward conductor, such that the longitudinal positions of the electrical junctions or of the groups of electrical junctions of each forward conductor differ from one another.

22. The method of claim 21, wherein each forward conductor and the plurality of return conductors are arranged in a common case having a lateral area and, in order to provide the electrical junctions or the groups of the electrical junctions:

the lateral area is opened at a longitudinal position,
a return conductor is welded to a forward conductor at the longitudinal position, and
the lateral area is subsequently closed.

* * * * *